US011742343B2

(12) United States Patent
Choi et al.

(10) Patent No.: US 11,742,343 B2
(45) Date of Patent: Aug. 29, 2023

(54) ELECTROSTATIC DISCHARGE PROTECTION DEVICE

(71) Applicant: SK hynix Inc., Gyeonggi-do (KR)

(72) Inventors: Joung Cheul Choi, Daejeon (KR); Chang Seok Song, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 190 days.

(21) Appl. No.: 17/397,615

(22) Filed: Aug. 9, 2021

(65) Prior Publication Data

US 2021/0366898 A1    Nov. 25, 2021

Related U.S. Application Data

(62) Division of application No. 16/555,355, filed on Aug. 29, 2019, now Pat. No. 11,088,133.

(30) Foreign Application Priority Data

Dec. 17, 2018  (KR) ........................ 10-2018-0163140

(51) Int. Cl.
  *H01L 27/02*  (2006.01)
  *H02H 9/04*   (2006.01)
  *H01L 29/74*  (2006.01)

(52) U.S. Cl.
  CPC ...... *H01L 27/0277* (2013.01); *H01L 27/0255* (2013.01); *H01L 27/0262* (2013.01); *H01L 27/0274* (2013.01); *H01L 27/0288* (2013.01); *H01L 27/0292* (2013.01); *H01L 29/7408* (2013.01); *H02H 9/046* (2013.01); *H01L 29/7404* (2013.01)

(58) Field of Classification Search
  CPC ........................ H01L 27/0274; H01L 27/0255
  See application file for complete search history.

(56) References Cited

U.S. PATENT DOCUMENTS

| 2005/0047042 | A1  | 3/2005  | Satou et al. |
| 2005/0212009 | A1* | 9/2005  | Sato ................... H01L 27/0262 257/107 |
| 2007/0284665 | A1  | 12/2007 | Nagai |
| 2008/0174924 | A1  | 7/2008  | Kang et al. |
| 2014/0327079 | A1  | 11/2014 | Etherton et al. |
| 2017/0069619 | A1  | 3/2017  | Toh et al. |
| 2018/0114787 | A1* | 4/2018  | Lin ........................ H01L 29/861 |

FOREIGN PATENT DOCUMENTS

| CN | 1630079 A      | 6/2005 |
| CN | 102110686 A    | 6/2011 |
| CN | 107611121 A    | 1/2018 |
| EP | 3007232 A1     | 4/2016 |
| JP | 2009-081458 A  | 4/2009 |

OTHER PUBLICATIONS

Office Action for the Chinese Patent Application No. 201910957998.7 issued by the Chinese Patent Office dated Feb. 3, 2023.

* cited by examiner

*Primary Examiner* — Farun Lu
(74) *Attorney, Agent, or Firm* — IP & T GROUP LLP

(57) ABSTRACT

An electrostatic discharge (ESD) protection device includes a pad, a diode, a gate ground NMOS (GGNMOS) transistor and a thyristor. The diode includes an anode connected with the pad. The GGNMOS transistor is connected between a cathode of the diode and a ground terminal. The thyristor is formed between the diode and the ground terminal when an ESD current may flow from the pad.

15 Claims, 6 Drawing Sheets

ELECTROSTATIC DISCHARGE PROTECTION DEVICE

CROSS-REFERENCES TO RELATED APPLICATION

This application is a division of U.S. patent application Ser. No. 16/555,355 filed on Aug. 29, 2019, which claims benefits of priority of Korean Patent Application No. 10-2018-0163140 filed on Dec. 17, 2018. The disclosure of each of the foregoing application is incorporated herein by reference in its entirety.

BACKGROUND

1. Technical Field

Various embodiments of the present invention generally relate to a semiconductor integrated circuit device and, more particularly, to an electrostatic discharge (ESD) protection device.

2. Related Art

A semiconductor integrated circuit device may include an electrostatic discharge (ESD) protection device for protecting an internal circuit. Typically, the ESD protection device is arranged between the internal circuit and a pad for receiving an external signal. An ESD protection device may have a MOS transistor structure, a silicon controlled rectifier (SCR) structure, etc.

Generally, an ESD protection device having the SCR structure may have a bypass capacity of an ESD stress current superior to that of an ESD protection device having the MOS transistor structure. In contrast, because an operational voltage may be lower than a holding voltage in the SCR structure, a latch-up may be generated in the SCR structure.

When an ESD protection device having a holding voltage that is lower than the operational voltage is used, ESD stresses may be generated in operating the semiconductor integrated circuit device which may result in the ESD protection device operating at an undesired timing. Further, after the ESD stresses have disappeared, the ESD protection device may continuously bypass a current due to the holding voltage being lower than the operational voltage to generate a latch-up between a power voltage terminal and a ground terminal of the ESD protection device.

When the holding voltage is increased to prevent the latch-up, a trigger voltage of the ESD protection device may also increase so that the ESD protection device may not be rapidly driven when a static electricity is generated.

SUMMARY

In example embodiments of the present invention disclosure, an electrostatic discharge (ESD) protection device may include an active well, a gate, a source, a drain, a diode region and a division well. The active well may have a first conductive type. The gate may be formed on the active well. The source may be formed in the active well at one side of the gate. The source may have a second conductive type. The drain may be formed in the active well at the other side of the gate. The drain may have the second conductive type. The diode region may be formed in the active well. The diode region may make contact with the drain. The diode region may have the first conductive type. The division well may be formed under the diode region. The division well may have the second conductive type. The gate, the source and the active well may be electrically connected with a ground terminal. The diode region may be electrically connected with a pad to which a bias may be applied.

In example embodiments of the present invention disclosure, an electrostatic discharge (ESD) protection device may include a semiconductor substrate, a P well, a first N well, a second N well, a gate, an N type source, an N type drain, a P type diode region, a P type butted or boundary region, a P well contact region, an N well contact region and a silicide layer. The P well may be formed in the semiconductor substrate. The first N well may be formed at an edge portion of the P well. The second N well may be formed in the P well to divide a space in the P well into a first region and a second region. The gate may be formed on the first region and the second region. The N type source may be formed in the first region and the second region at one side of the gate. The N type drain may be formed in the first region and the second region between the gate and the second N well. The P type diode region may be formed in the second N well between the drains. The P type butted or boundary region may be formed between the gate and the source. The P well contact region may be formed in the P well. The N well contact region may be formed in the first N well. The silicide layer may be selectively formed on the source, the diode region, the P well contact region and the N well contact region.

In example embodiments of the present invention disclosure, an electrostatic discharge (ESD) protection device may include a pad, a diode, a gate ground NMOS (GGNMOS) transistor and a thyristor. The diode may include an anode connected with the pad. The GGNMOS transistor may be connected between a cathode of the diode and a ground terminal. The thyristor may be formed between the diode and the ground terminal when an ESD current may flow from the pad.

In example embodiments of the present invention disclosure, an electrostatic discharge (ESD) protection device may include a gate, a source, a diode, a first peripheral well and a boundary region. The gate is formed over an active well. The source and a drain are formed in the active well on either side of the gate. The diode region is formed in the active well adjacent and in contact with the drain. The first peripheral well is formed under the diode region in the active well. The boundary region includes impurities of the first conductive type formed in the active well between the gate and the source. The gate, the source and the active well are electrically connected with a ground terminal, and the diode region is electrically connected with a pad to which a bias is applied. The boundary region has an effective width for controlling a holding voltage of the ESD higher than an operating voltage.

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Various embodiments of the present invention will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

As used herein, singular forms are intended to include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure.

It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

It should be understood that in describing the various embodiments of the present invention details which are well-known in the art may be omitted for avoiding obscuring the description of the features of the invention.

It should also be noted that features of the present invention which may be described in relation to one embodiment may also be used with one or more features of another embodiment without departing from the scope of the invention. In this regard it should be understood that the skilled person having read the present invention disclosure may envision further embodiments and/or variations thereof which do not fall outside the scope of the present invention.

Figure 1:
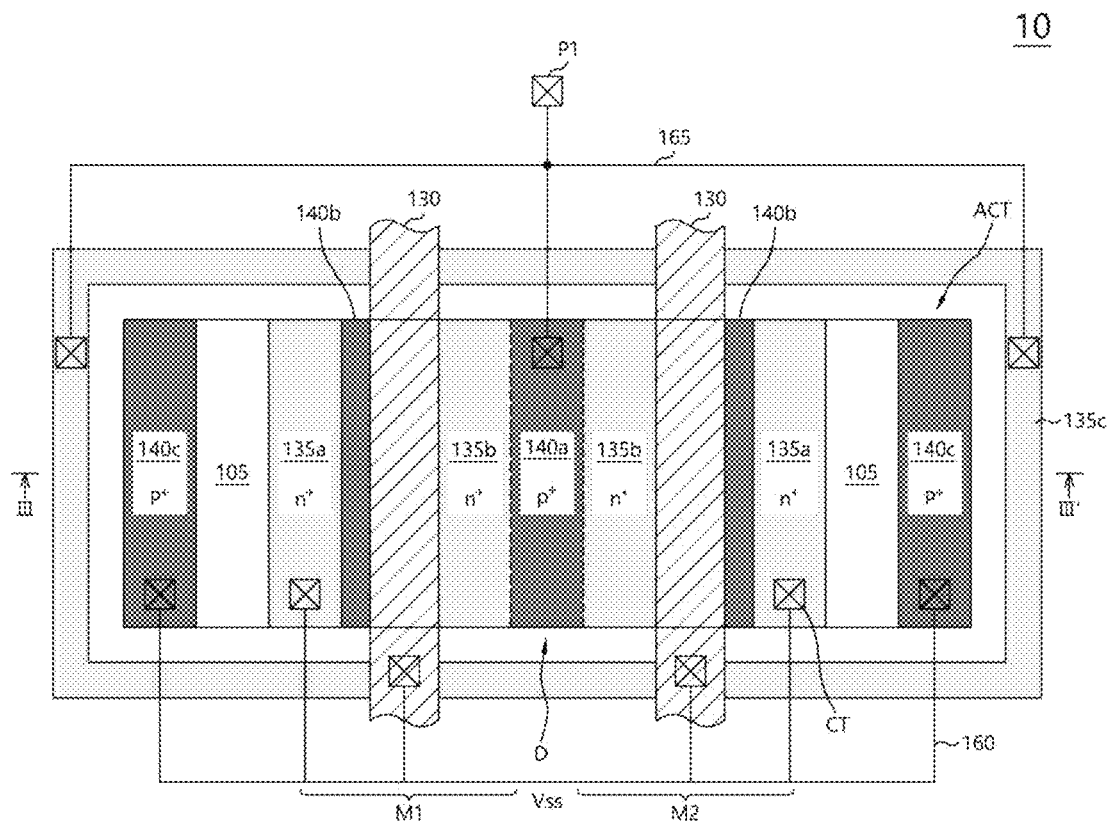
FIG. 1 is a plan view illustrating an ESD protection device in accordance with an embodiment of the present invention.

FIG. 1 is a plan view illustrating an ESD protection device in accordance with an embodiment of the present invention.

Referring to FIG. 1, an ESD protection device 10 may be integrated on an active region ACT defined on a semiconductor substrate. The active region ACT may include a P well (not shown) where a gate grounded N-MOS transistor (GGNMOS transistor) may be formed. Hereinafter, the active region ACT and the P well may be referred to as an active well. Further, the active well ACT of this example embodiment may have a size for receiving first and second GGNMOS transistors M1 and M2.

Each of the first and second GGNMOS transistors M1 and M2 may include a gate 130, a source 135*a* and a drain 135*b*. The gate 130 may be arranged on the active well ACT. The source 135*a* may be arranged in the active well ACT at one side of the gate 130. The drain 135*b* may be arranged in the active well ACT at the other side of the gate 130. The drain 135*b* of the first GGNMOS transistor M1 may be spaced apart from the drain 135*b* of the second GGNMOS transistor M2.

A P type impurity region 140*a* may be formed in the active well between the drain 135*b* of the first GGNMOS transistor M1 and the drain 135*b* of the second GGNMOS transistor M2. Thus, a diode D may be formed by forming the P type impurity region 140*a* between the drains 135*b*. Hereinafter, the P type impurity region 140*a* may be referred to as the diode region.

Butted or boundary regions 140*b* including P type impurities may be formed between the gate 130 and the source 135*a* in the first and second GGNMOS transistors M1 and M2. For example, the butted or boundary regions 140*b* may not overlap vertically with the respective gates 130 of the first and second GGNMOS transistors M1 and M2. Because the butted or boundary regions 140*b* may include the P type impurities which are different from the N type impurities constituting the source 135*a*, the butted or boundary regions 140*b* increase a resistance of the parasitic bipolar junction transistor (BJT) of the GGNMOS transistors M1 and M2. Thus, a holding voltage of the ESD protection device 10 may be increased.

A reference numeral 135*c* indicates a first well contact region (or N well contact region) for providing an N type peripheral well, which may be configured to surround the active well ACT, with a voltage. A reference numeral 140*c* indicates a second well contact region (or P well contact region) for providing the active well ACT with a voltage. In example embodiments, the first well contact region 135*c* may have a frame shape configured to surround the active well ACT. Alternatively, the first well contact region 135*c* may have a stripe shape.

The P type impurity region 140*a* and the first well contact region 135*c* may electrically make contact with a conductive line 165 connected with a pad P1. An external voltage may be applied to the P type impurity region 140*a* and the first well contact region 135*c*. The gate 130, the source 135*a* and the butted or boundary regions 140*b* may electrically make contact with a conductive line 160 connected with a ground terminal.

A reference numeral CT indicates a contact connected with conductive lines. The contact CT may include a silicide layer for improving a contact resistance. A reference numeral 105 indicates an isolation layer corresponding to a shallow trench isolation (STI) layer.

Figure 2:
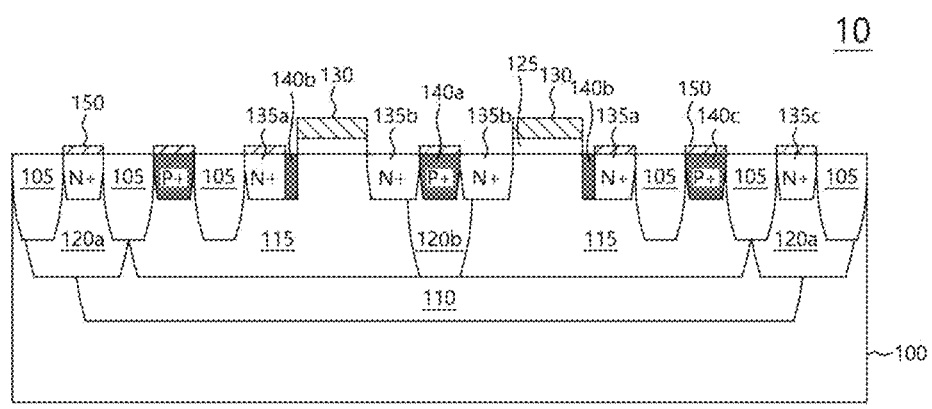
FIGS. 2 and 3 are cross sectional views taken along a line III-III' in FIG. 1.
Figure 3:
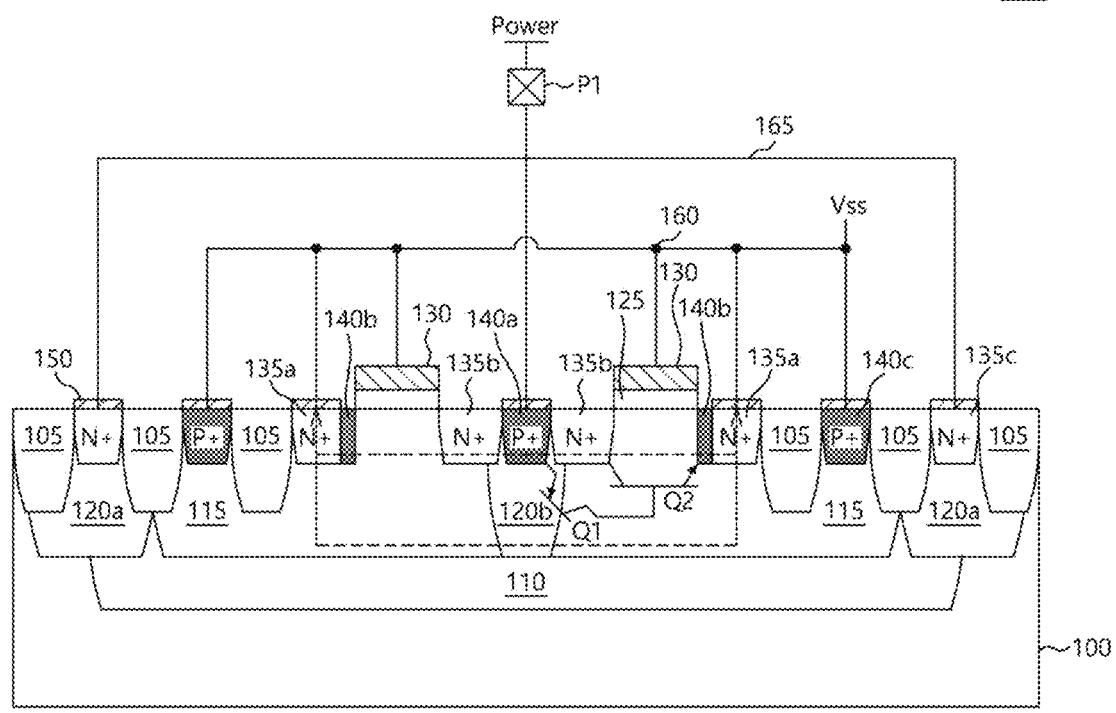

FIGS. 2 and 3 are cross sectional views taken along a line III-III' in FIG. 1.

Referring to FIG. 2, a deep N well 110 may be formed in a semiconductor substrate 100. The semiconductor substrate 100 may include a P type substrate. The semiconductor substrate 100 may include silicon. The deep N well 110 may be formed by deeply implanting N type impurities into the semiconductor substrate 100. The deep N well 110 may be formed within the semiconductor substrate 100 away from a surface of the semiconductor substrate 100 by a first depth. The deep N well 110 may be a part of a peripheral well formed at an outskirt of an active well to be formed. The deep N well 110 may define a lower boundary of the active well.

The active well 115 for forming the ESD protection device may be formed in the semiconductor substrate 100 over the deep N well 110. The active well 115 may have a second depth less than the first depth. The active well 115 may include a P well having P type impurities.

N type impurities may be implanted into an edge portion and a central portion of the active well 115 to form peripheral wells 120*a* and 120*b*, i.e., N wells. The peripheral well 120*a* may include two peripheral wells 120*a* formed in respective left and right edge portions of the active well 115 and may each make contact with the deep N well 110. The peripheral well 120*b* is formed in the central portion of the active well 115 and may make contact with the deep N well 110. The peripheral well 120*b* may function as a division well for dividing the active well 115 into a first region where the first GGNMOS transistor may be formed and a second region where the second GGNMOS transistor may be formed.

An isolation layer 105 may be formed between the active well 115 and each of the left and right peripheral wells 120*a*. The isolation layer 105 may be formed on both sides of each of the left and right peripheral wells 120*a*. The isolation layer 105 may also be formed on both sides of the second well contact region 140*c*. Hence, the isolation layer may be formed outside the peripheral wells 120*a* and in the active well 115. The isolation layer 105 may electrically isolate the active well 115 from the peripheral wells 120*a*. Further, the isolation layer 105 may define a space where a well contact region for applying a bias to the peripheral wells 120*a* and the active well 115 may be formed.

The gates 130 may be formed on the active well 115 where the first GGNMOS transistor and the second GGNMOS transistor may be formed. A gate insulation layer 125 may be formed between the active well 115 and the gates 130.

N type impurities may be implanted into the active well 115 at both sides of the gates 130 and in each of the peripheral wells 120*a* to form sources 135*a*, drains 135*b* and a first well contact region 135*c*. The first well contact region 135*c* includes a right first well contact region 135*c* formed in the right first peripheral well 120*a* and a left first well contact region 135*c* formed in the left peripheral well 120*a*. The sources 135*a* may be formed at one side of the respective gates 130 of the first and second GGNMOS transistors M1, M2. The sources 135*a* may be spaced apart from one sidewall of the respective gates 130 of the first and second GGNMOS transistors M1, M2. The drains 135*b* may be formed at the other side of the respective gates 130 of the first and second GGNMOS transistors M1, M2. The drains 135*b* may partially overlap with the other side of the respective gates 130 of the first and second GGNMOS transistors M1, M2. The drains 135*b* of the first and second GGNMOS transistors may be formed at both sides of the peripheral well 120*b*. The first well contact regions 135*c* may be formed in the respective peripheral wells 120*a*. A mask pattern may be used for forming the sources 135*a*, the drains 135*b* and the first well contact regions 135*c* in the semiconductor substrate 100.

P type impurities may be implanted into the peripheral well 120*b* between the drains 135*b*, a portion between the gate 130 and the source 135*a*, and the active well 115 to form a diode region 140*a*, butted or boundary regions 140*b* and a second well contact region 140*c*. The second well contact region may include left and right second well contact regions 140*c*. The diode region 140*a* may be formed inside a top portion of the peripheral well 120*b* between the drains 135*b* to form a PN junction with the peripheral well 120*b*. The butted or boundary regions 140*b* may be formed between the gate 130 and the source 135*a*. The butted or boundary regions 140*b* may increase resistances of the GGNMOS transistors M1 and M2. Because the parasitic BJT resistance of the GGNMOS transistors M1 and M2 may be increased proportionally to increasing a width of the butted or boundary regions 140*b*, a holding voltage may be increased as desired by controlling the width of the boundary regions 140*b*. The second well contact regions 140*c* may be formed in the active well 115 surrounded by the isolation layer 105. The second well contact regions 140*c* may be connected to a conductive line by a following process to apply a bias to the active well 115. A mask pattern may be used for forming the diode region 140*a*, the butted or boundary regions 140*b* and the second well contact regions 140*c* in the semiconductor substrate 100.

A silicide layer 150 may be selectively formed on the source 135*a* of the GGNMOS transistors M1 and M2, the first well contact region 135*c*, the diode region 140*a* and the second well contact regions 140*c*. Particularly, a blocking layer including a dielectric material may be formed on the semiconductor substrate 100. The blocking layer may include an insulation layer. The blocking layer may be etched to expose the sources 135*a*, the first well contact region 135*c*, the diode region 140*a* and the second well contact regions 140*c*. A transition metal layer may be formed on the blocking layer, the sources 135*a*, the first well contact region 135*c*, the diode region 140*a* and the second well contact regions 140*c*. The transition metal layer may be thermally treated so that silicon in the sources 135*a*, the first well contact region 135*c*, the diode region 140*a* and the second well contact regions 140*c* may be reacted with the thermally treated transition metal layer. Thus, the silicide layer 150 may be selectively formed on the sources 135*a*, the first well contact region 135*c*, the diode region 140*a* and the second well contact regions 140*c*. The blocking layer and the transition metal layer may then be removed.

Referring to FIG. 3, conductive lines 160 and 165 may make contact with the silicide layer 150. For example, the gates 130 of the GGNMOS transistors M1 and M2, the diode region 140*a* and the second well contact regions 140*c* covered with the silicide layer 150 may make contact with the first conductive line 160 so that the gates 130 of the GGNMOS transistors M1 and M2, the diode region 140*a* and the second well contact regions 140*c* covered with the silicide layer 150 may be electrically connected with a ground terminal Vss. Further, the sources 135*a* of the GGNMOS transistors M1 and M2 and the first well contact region 135*c* covered with the silicide layer 150 may make contact with the second conductive line 165 so that the sources 135*a* of the GGNMOS transistors M1 and M2 and the first well contact region 135c covered with the silicide layer 150 may be electrically connected with a pad P1. FIG. 3 schematically shows the connections between the Pad P1 which may be connected to a power terminal. The conductive lines 160 and 165 may include a plug and a metal wiring in an insulating interlayer.

When a bias is forced through the pad P1, an ESD current may flow into the diode region 140a, not the drains 135b of the GGNMOS transistors M1 and M2. Thus, a parasitic PNP transistor Q1 may be formed between the diode region 140a and the peripheral well 120b or the drain 135b, and between the diode region 140a and the active well 115 to form an ESD current path. Further, a parasitic NPN transistor Q2 may be formed between the peripheral well 120b or the drain 135b and the active well 115, and between the peripheral well 120b and the source 135a to form an ESD current path for discharging the ESD current to the ground terminal Vss. The parasitic PNP transistor Q1 and the parasitic NPN transistor Q2 may form a thyristor to discharge the ESD current relatively more than that discharged by the GGNMOS transistors M1 and M2. As a result, the parasitic thyristor may increase an ESD current tolerance of the ESD protection device.

The butted or boundary regions 140b including the P type impurities may be formed between the gate 130 and the source 135a of the GGNMOS transistors M1 and M2 to expand a base width of the parasitic NPN transistor formed between the source 135a/butted or boundary region 140b and the active well 115/drain 135b. Therefore, a current gain of the NPN transistor may be decreased to ensure a high hold voltage.

Figure 4:
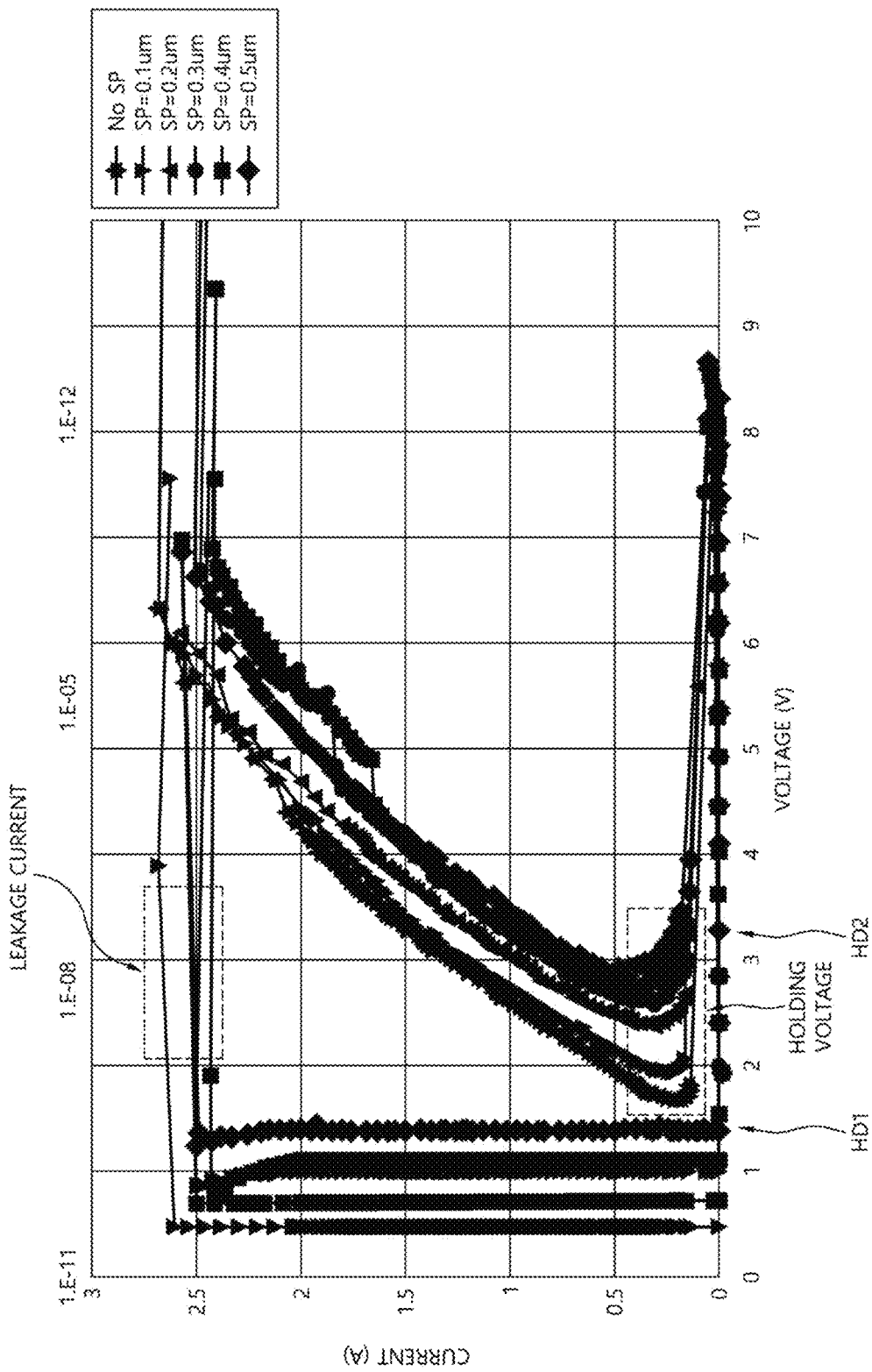
FIG. 4 is a graph showing changes of a holding voltage of an ESD in accordance with a width of a butted or boundary region.

FIG. 4 is a graph showing changes of a holding voltage in accordance with a width of the butted or boundary region.

Referring to FIG. 4, when the boundary or butted region 140b is not formed, the ESD protection device may have a holding voltage of about 1.7V (HD1). In contrast, when the butted or boundary region 140b is formed, it can be noted that the holding voltage (HD2) of the ESD protection device may be increased in proportion to a width of the boundary or butted region 140b.

For example, when the butted or boundary region 140b may have a width of about 0.1 μm, the holding voltage of the ESD protection device may be about 1.9V. When the butted or boundary region 140b may have a width of about 0.5 μm, the holding voltage of the ESD protection device may be about 3V.

Figure 5:
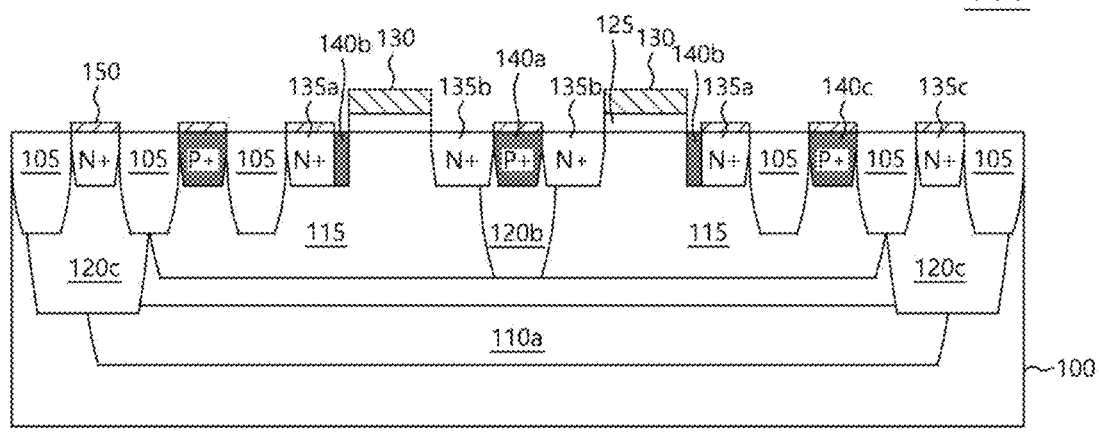
FIG. 5 is a cross-sectional view illustrating an ESD protection device in accordance with an embodiment of the present invention.

FIG. 5 is a cross-sectional view illustrating an ESD protection device in accordance with an embodiment of the present invention.

An ESD protection device of this embodiment may include elements substantially the same as those of the ESD protection device in FIG. 3 except for an N well for defining a lower boundary of an active region ACT. Thus, the same reference numerals may refer to the same elements and any further illustrations with respect to the same elements may be omitted herein for brevity.

Referring to FIG. 5, an N type buried layer (NBL) 110a may be formed in the semiconductor substrate 100 to define a lower boundary of the active region ACT. The NBL 110a may include an impurity region having a layered structure. The NBL 110a may have a depth greater than that of the deep N well 110 of FIG. 2 and FIG. 3. For example, the NBL 110a may have a third depth from the surface of the semiconductor. Thus, the NBL 110a may be spaced apart from a bottom surface of the active well 115.

Further, the first peripheral well 120c at the edge portion of the active well 115 may have a depth greater than that of the peripheral well 120b to make contact with the NBL 110a. Thus, the active well 115 may be surrounded by the NBL 110a and the first peripheral wells 120c.

According to an embodiment, the ESD protection device including the active region ACT defined by the NBL 110a may have effects substantially the same as those of the ESD protection device in FIG. 3.

Figure 6:
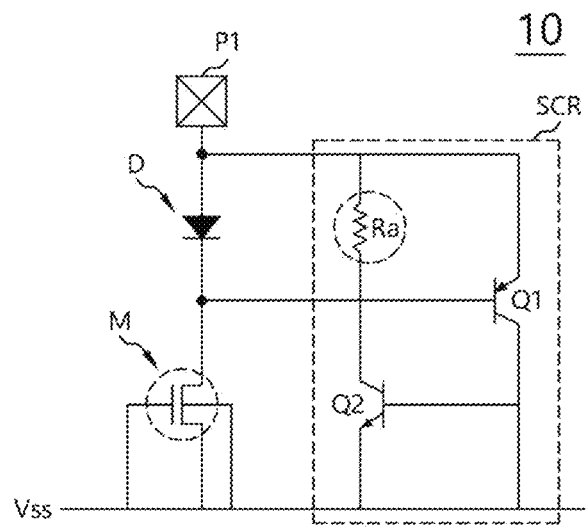
FIG. 6 is an equivalent circuit diagram illustrating an ESD protection device in accordance with an embodiment of the present invention.

FIG. 6 is an equivalent circuit diagram illustrating an ESD protection device in accordance with an embodiment of the present invention.

Referring to FIG. 6, the ESD protection device 10 may be connected between the pad P1 and the ground terminal Vss. The ESD protection device 10 may include a GGNMOS transistor M and a parasitic thyristor SCR.

The GGNMOS transistor M may include a drain, a gate and a source. The drain may be connected with the pad P1 through a diode D. The gate may be connected with the ground terminal Vss. The diode D may be formed by forming the diode region 140a in the drain 135b in FIG. 2.

According an embodiment, the ESD protection device 10 may include the parasitic thyristor SCR by forming the diode region 140a in the GGNMOS transistor M. Thus, when the ESD current may flow into the ESD protection device through the pad P1, the parasitic thyristor SCR may be turned-on to generate the ESD current path between the pad P1 and the ground terminal Vss. Particularly, because the thyristor SCR may have an ESD stress current tolerance higher than that of the GGNMOS transistor, the ESD protection device including the thyristor SCR may be integrated in an area smaller than that in which the ESD protection device including only the GGNMOS transistor. Reference numeral Ra indicates a junction resistance generated by the diode region 140a.

Figure 7:
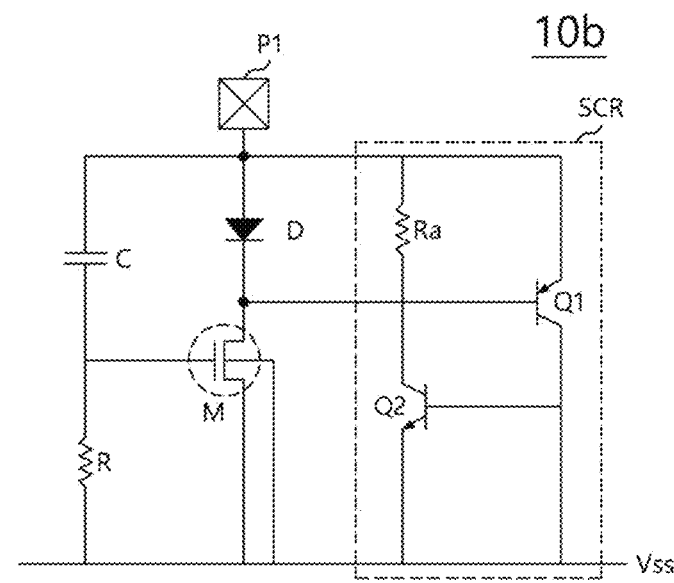
FIG. 7 is a view illustrating a GGNMOS type ESD protection device in accordance with an embodiment of the present invention.

FIG. 7 is a view illustrating a GGNMOS type ESD protection device in accordance with an embodiment of the present invention.

Referring to FIG. 7, in order to decrease a trigger voltage of an ESD protection device 10b, the ESD protection device 10b may further include a capacitor C and a resistance R connected to a gate terminal of the GGNMOS transistor M. The capacitor C may be connected between an anode of the diode D and the gate 130. The resistance R may be connected between the gate 130 and the ground terminal Vss.

According to an embodiment, a turn-on timing of the ESD protection device 10 may be determined by an RC time constant represented by a multiplied number of the resistance R and the capacitor C. Therefore, the resistance R and the capacitor C may be adjusted to decrease the trigger voltage.

Figure 8A:
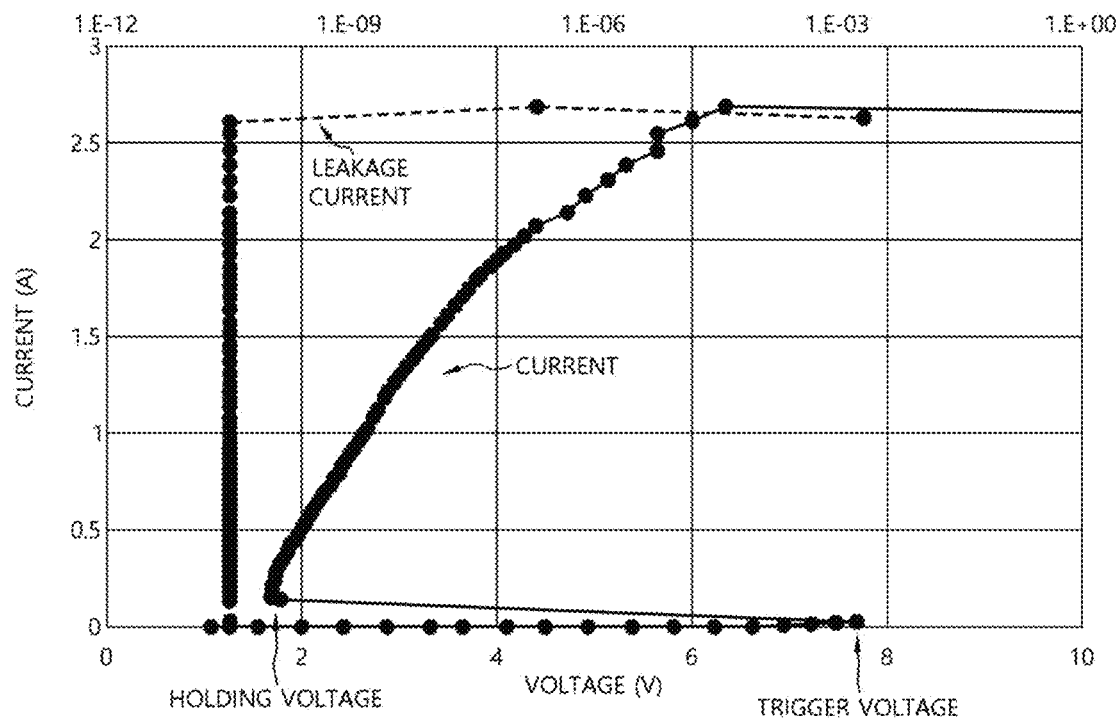
FIG. 8A is a graph showing current-voltage characteristics of an ESD protection device without a resistance and a capacitor.
Figure 8B:
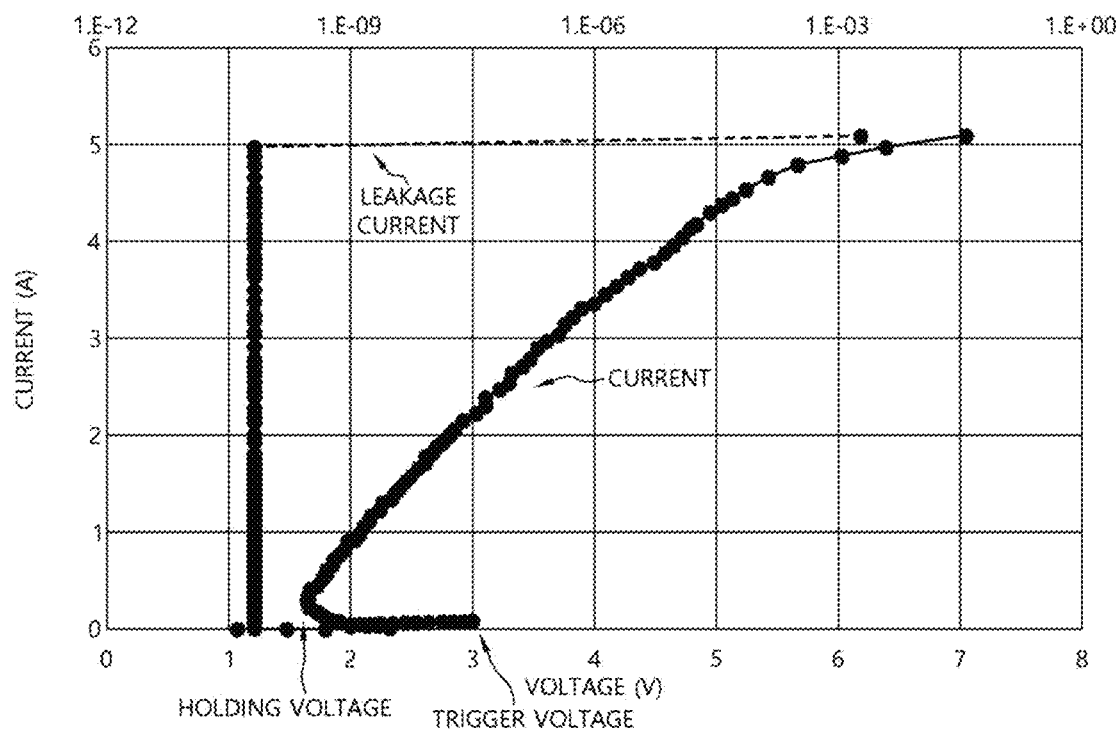
FIG. 8B is a graph showing current-voltage characteristics of an ESD protection device with a resistance and a capacitor.

FIG. 8A is a graph showing current-voltage characteristics of an ESD protection device without a resistance and a capacitor, and FIG. 8B is a graph showing current-voltage characteristics of an ESD protection device with a resistance and a capacitor.

Referring to FIGS. 8A and 8B, it can be noted that the trigger voltage may be decreased when the resistance R and the capacitor C may be formed at the gate terminal of the GGNMOS transistor.

According an embodiment, the diode region may form the PN junction with the drain of the GGNMOS transistor to form the parasitic thyristor. Thus, the ESD protection device including the thyristor may have the ESD stress current tolerance higher than that of the ESD protection device including only the GGNMOS transistor. The resistance and the capacitor may be connected to the gate terminal of the GGNMOS transistor to decrease the trigger voltage.

Further, the butted or boundary region having a conductive type opposite to that of the source may be formed in the source of the GGNMOS transistor to extend the base width of the bipolar transistor parasitically formed in the GGNMOS transistor. Therefore, the holding voltage may be increased. As a result, the ESD protection device may have the low trigger voltage and the high holding voltage.

The above described embodiments of the present invention are intended to illustrate and not to limit the present invention. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. An electrostatic discharge (ESD) protection device for an integrated circuit, the ESD comprising:
   a gate formed over an active well;
   a source and a drain formed in the active well on either side of the gate; and
   a boundary region formed in the active well between the gate and the source, a conductive type of the boundary region being opposite to a conductive type of the source and the drain,
   wherein the boundary region has an effective width for controlling a holding voltage of the ESD higher than an operating voltage.

2. The ESD protection device of claim 1, further comprising:
   a first peripheral well formed in the active well corresponding to an outside portion of the drain; and
   a diode region formed in the first peripheral well to be contacted with the drain.

3. The ESD protection device of claim 2, wherein the active well, the boundary region and the diode region include impurities of a first conductive type, and
   the source, drain and the first peripheral well include impurities of a second conductive type being opposite to the first conductive type.

4. The ESD protection device of claim 3, wherein the impurities of the first conductive type have a p type conductive type and the impurities of the second conductive type have a n type conductive type.

5. The ESD protection device of claim 1, wherein a depth of the boundary region is same with depths of the source and drain.

6. The ESD protection device of claim 2, further comprising:
   a deep well formed under the active well; and
   a second peripheral well formed to surround an edge of the active well.

7. The ESD protection device of claim 6, wherein the active well, the first peripheral well and the second peripheral well include a same depth, and bottom surfaces of the active well, the first peripheral well and the second peripheral well are contacted with the deep well.

8. The ESD protection device of claim 2, wherein the gate, the source and the active well are electrically connected with a ground terminal, and the diode region is electrically connected with a pad to which a bias is applied.

9. The ESD protection device of claim 2, further comprising:
   an ohmic contact pattern formed on the source and the diode region, respectively.

10. An electrostatic discharge (ESD) protection device for an integrated circuit, the ESD comprising:
    a gate formed over an active well with impurities of a first conductive type;
    a source and a drain formed in the active well on either side of the gate, the source and the drain including impurities of a second conductive type which is opposite to the first conductive type;
    a diode region formed in the active well adjacent and in contact with the drain, the diode region including the impurities of the first conductive type;
    a first peripheral well formed under the diode region in the active well, the first peripheral well including the impurities of second conductive type; and
    a boundary region including the impurities of the first conductive type formed in the active well between the gate and the source,
    wherein the gate, the source and the active well are electrically connected with a ground terminal, and the diode region is electrically connected with a pad to which a bias is applied, and
    wherein the boundary region has an effective width for controlling a holding voltage of the ESD higher than an operating voltage.

11. The ESD protection device of claim 10, further comprising:
    a second peripheral well formed to surround an edge of the active well,
    wherein the second peripheral well includes the impurities of the second conductive type.

12. The ESD protection device of claim 10, wherein a depth of the boundary region is same with depths of the source and drain.

13. The ESD protection device of claim 10, wherein the source does not overlap the gate by the boundary region.

14. The ESD protection device of claim 11, wherein the active well and the second peripheral well include a well contact region, respectively.

15. The ESD protection device of claim 14, further comprising:
    an ohmic contact pattern formed on the source, the diode region and the well contact regions, respectively.

* * * * *